(12) United States Patent
Tomishima (10) Patent No.: US 9,268,690 B2
(45) Date of Patent: *Feb. 23, 2016

(54) CIRCUITS AND METHODS FOR PROVIDING DATA TO AND FROM ARRAYS OF MEMORY CELLS

(71) Applicant: MICRON TECHNOLOGY, INC., Boise, ID (US)

(72) Inventor: Shigeki Tomishima, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/515,849

(22) Filed: Oct. 16, 2014

(65) Prior Publication Data

US 2015/0039843 A1 Feb. 5, 2015

Related U.S. Application Data

(63) Continuation of application No. 12/940,852, filed on Nov. 5, 2010, now Pat. No. 8,873,314.

(51) Int. Cl.

| G11C 7/22 | (2006.01) |
|---|---|
| G11C 7/00 | (2006.01) |
| G11C 7/02 | (2006.01) |
| G11C 5/14 | (2006.01) |
| G06F 12/06 | (2006.01) |
| G11C 7/10 | (2006.01) |
| G06F 1/26 | (2006.01) |

(52) U.S. Cl.
CPC ............... *G06F 12/06* (2013.01); *G06F 1/266* (2013.01); *G11C 7/1069* (2013.01); *G11C 7/1096* (2013.01); *G06F 2212/251* (2013.01)

(58) Field of Classification Search
USPC ............... 365/189.15, 189.16, 203, 205, 207, 365/208, 226
See application file for complete search history.

(56) References Cited

U.S. PATENT DOCUMENTS

| 6,198,682 B1 | 3/2001 | Proebsting |
|---|---|---|
| 6,377,512 B1 | 4/2002 | Hamamoto et al. |
| 7,266,030 B2 | 9/2007 | Do et al. |
| 7,359,268 B2 | 4/2008 | Kang et al. |
| 7,466,615 B2 | 12/2008 | Tomishima |
| 7,619,935 B2 | 11/2009 | Kim et al. |
| 7,859,930 B2 | 12/2010 | Foss |
| 7,916,558 B2 | 3/2011 | Do |
| 7,948,811 B2 | 5/2011 | Vernet |
| 8,081,530 B2 | 12/2011 | Chou |
| 8,159,898 B2 | 4/2012 | Yoon |
| 8,174,920 B2 | 5/2012 | Matsuoka et al. |
| 2012/0117336 A1 | 5/2012 | Tomishima |

OTHER PUBLICATIONS

Kyung, et al., "A 800Mb/s/pin 2Gb DDR2 SDRAM using an 80nm Triple Metal Technology", IEEE International Solid-State Circuits Confrences, Feb. 9, 2005, 468-470.

Moon, et al., "1.2V 1.6b/s 56nm 6F2 4Gb DDR3 SDRAM with Hybrid-I/O Sense Amplifier and Segmented Sub-Array Architechture", IEEE International Solid-State Circuits Conference, Dec. 2009, 128-130.

*Primary Examiner* — Trong Phan
(74) *Attorney, Agent, or Firm* — Dorsey & Whitney LLP (57) ABSTRACT

A memory device uses a global input/output line or a pair of complementary global input/output lines to couple write data signals and read data signals to and from a memory array. The same input/output line or pairs of complementary global input/output lines may be used for coupling both write data signals and read data signals.

22 Claims, 6 Drawing Sheets

CIRCUITS AND METHODS FOR PROVIDING DATA TO AND FROM ARRAYS OF MEMORY CELLS

CROSS REFERENCE TO RELATED APPLICATION(S)

This application is a continuation of U.S. patent application Ser. No. 12/940,852, filed Nov. 5, 2010, and issued as U.S. Pat. No. 8,873,314 on Oct. 28, 2014. This application and patent are incorporated herein by reference, in its their entirety, for any purpose.

TECHNICAL FIELD

Embodiments of this invention relate to memory devices, and, more particularly, to provide data to and from memory cells in memory devices.

BACKGROUND OF THE INVENTION

As the state of memory devices and other digital devices continues to evolve, the operating, speeds of such devices has continued to increase. However, various factors may limit the speed at which such devices may operate. For example, signal line capacitance may limit the rate at which voltages on signal lines may change, thereby limiting the speed at which the line may be driven from a first level to a second logic level. If a signal transmitted over the line has not had time to reach a voltage level that can be detected as the second logic level, a data error may occur. Therefore, the operating speed of digital devices may be limited by the need to provide sufficient time for signals to propagate through signal lines.

Another goal in the development of memory devices and other digital devices is to minimize the power consumed by such devices. Such devices ma increasingly be portable and thus powered by batteries, so reducing power consumption has the desirable effect of increasing the period of time that the device may be used between battery charges. Even if the amount of battery life between charges is not a consideration, minimizing power consumption may have the desirable effect of minimizing the amount of heat generated by the device. One conventional approach to minimizing power dissipation is to minimize the voltage difference between binary logic levels. As a result, the change in voltage when transitioning from one logic level to another is decreased. This reduced voltage change has the effect of reducing power consumption since transistors used in logic circuits conventionally dissipate substantially more power when switching between logic levels.

Unfortunately, the goal of maximizing operating speed may inherently conflict with the goal of minimizing power consumption. As the voltage differential between logic levels is decreased for the purpose of reducing power consumption, the time required to transition from a voltage corresponding to one logic, level to a voltage that can be detected as corresponding to another logic level may increase, thereby limiting operating speed. Thus, there is often a tradeoff between power consumption and operating speed. This tradeoff may become more problematic when coupling digital signals through longer signal lines because longer signal lines tend to create higher line capacitances. For example, global input/output lines in a memory device may extend to a large number of memory arrays, thereby resulting in substantial line capacitance. It can therefore be difficult to minimize power consumption of memory devices and, at the same time, increase to operating speed of memory devices.

DETAILED DESCRIPTION

Figure 1:
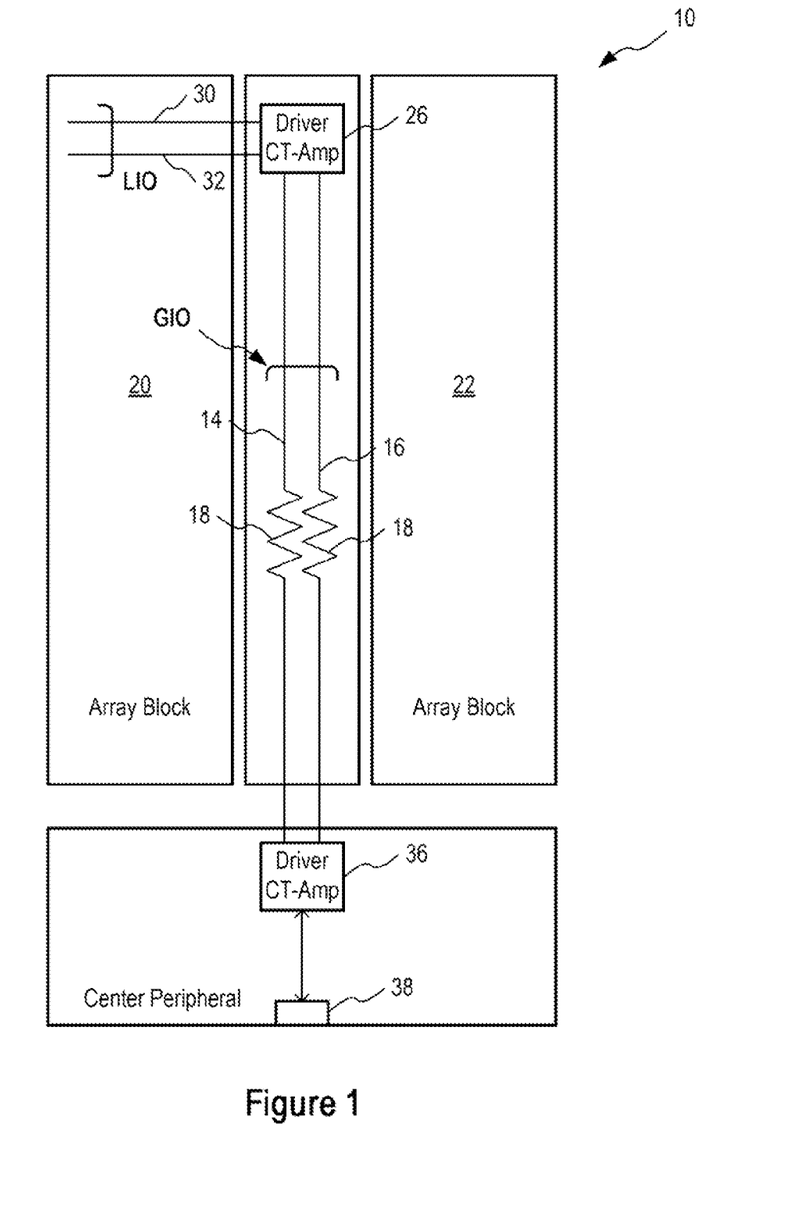
FIG. 1 is a logic diagram showing one embodiment of a data coupling circuit.

A memory device data coupling circuit 10 according to one embodiment is shown in FIG. 1. The coupling circuit 10 may include a pair of complementary global input/output ("I/O") GIO lines 14, 16 that extend along a plurality of memory arrays, only two of which 20, 22, are shown in FIG. 1. However, it should be understood that more than two memory arrays may be used in various memory device embodiments. The global I/O lines 14, 16 may inherently have some resistance, which is represented in FIG. 1 by respective resistors 18. The global I/O lines 14, 16 may be coupled to a driver current transfer ("CT") amplifier 26, one of which may be provided for each of the memory arrays 20, 22 although only one CT amplifier 26 is shown in FIG. 1. The CT amplifier 26 may be coupled to a pair of complementary local I/O LIO lines 30, 32 that extend through the memory array 20. As is well-known in the art, the local I/O lines may be selectively coupled to a plurality of complementary digit (e.g., bit) line pairs for a respective plurality of columns of memory cells in the array 20.

The global I/O lines 14, 16 may also be coupled to a second CT amplifier 36, which may be fabricated in a center peripheral area of a semiconductor substrate in which the data coupling circuit 10 may be fabricated. The second CT amplifier 36 may be coupled to a data bus terminal 38 or other data node, that may be externally accessible. As explained in greater detail below, the global I/O lines 14, 16 may be used for both providing write data signals (corresponding to, for example, external data signals from the data bus terminal 34) to the local I/O lines 30, 32 and for providing read data signals (corresponding to, for example, local data signals on local I/O lines 30, 32) to the data bus terminal 38. Although only one data coupling circuit 10 is shown in FIG. 1, it will be understood that a data coupling circuit may be provided for each of a plurality of data bus terminals used to provide write data bits to and read data bits from a memory device in parallel.

Figure 2:
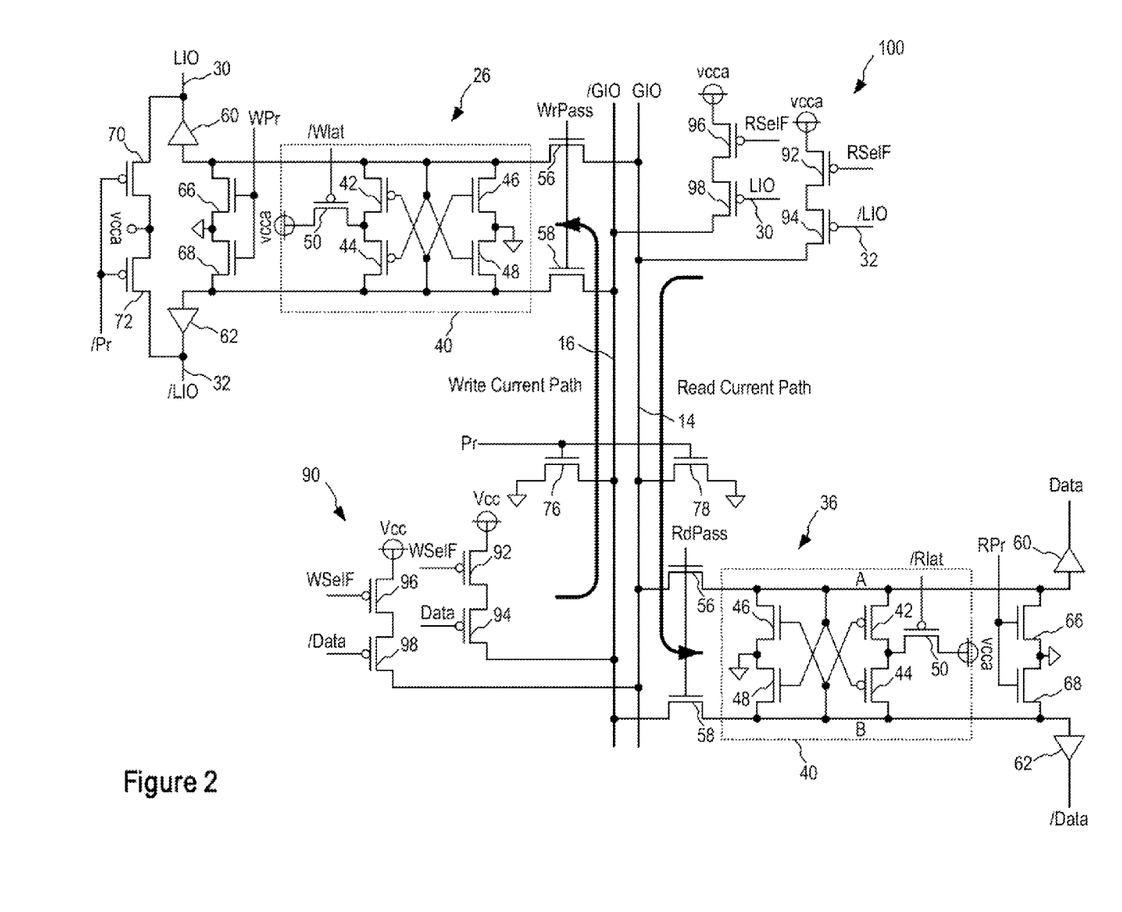
FIG. 2 is a logic diagram showing another embodiment of a data coupling circuit.

An embodiment of the CT amplifier 26 and an embodiment of the CT amplifier 36 coupled to each other as shown in FIG. 1 is shown in FIG. 2. The CT amplifier 26 may include a sense amplifier 40 having pair of cross-coupled transistors of a first type, such as p-channel transistors 42, 44, and a pair of cross-coupled transistors of a second type, such as n-channel transistors 46, 48. The sources of the p-channel transistors 42, 44 may be coupled through a p-type transistor 50 to a voltage Vcca, which may have a magnitude that is the same or different from the magnitude of a supply voltage Vcc. The conductivity of the transistor 50 may be controlled by an active low signal /Wlat. Finally, the sources of the n-channel transistors 46, 48 may be coupled to a voltage, such as ground.

With further reference to FIG. 2, the sense amplifier 40 may be selectively coupled to the global I/O lines GIO, /GIO 14, 16 through respective n-type transistors 56, 58, respectively. As explained, in further detail below, the transistors 56, 58 may be turned ON by an active high WrPass signal during a write operation. The local I/O lines LIO, /LIO 30, 32 may be coupled to the outputs of respective tri-state drivers 60, 62, which have their inputs coupled to complementary nodes of the sense amplifier 40. The complementary nodes of the sense amplifier 40 may also be coupled to a voltage, such as ground, through respective n-type transistors 66, 68. As also explained in further detail below, the transistors 66, 68 are turned ON by an active high WPr signal to precharge the complementary nodes of the sense amplifier 40 to ground prior to a write operation. Prior to a write operation, the local I/O lines 30, 32 may also be equilibrated by an active low /Pr signal turning ON a pair of p-type transistors 70, 72, thereby coupling the local lines 30, 32 to a voltage, such as Vcca. Similarly, prior to both a write operation and a read operation, the global I/O lines 14, 16 may be equilibrated by an active high Pr signal turning on a pair of n-type transistors 76, 78, thereby coupling the global I/O lines 14, 16 to a voltage, such as ground.

The global I/O lines 14, 16 may also be coupled to a write data driver circuit 90 included in the CT amplifier 36. The write data driver circuit 90 may function provide write data signals (corresponding to, for example, external data signals) to the global I/O lines 14, 16 during a write operation. More specifically, the global I/O line 14 may be coupled to a voltage, such as Vcc, though a pair of series coupled p-type transistors 92, 94. The gate of the transistor 92 may be coupled to receive an active low WSelF signal, and the gate of the transistor 94 may be coupled to receive an external data signal Data. Similarly, the complementary global I/O line 16 may be coupled to a supply voltage Vcc though a pair of series coupled p-type transistors 96, 98. The gate of the transistor 96 is also coupled to receive the active low WSelF signal, and the gate of the transistor 98 may be coupled to receive a complementary external data signal /Data.

In operation, the WSelF signals are driven low during a write operation to turn ON the transistors 92, 96. If the data bit being written is a logic "1," the Data signal will be high and /Data signal will be low. Therefore, the low /Data signal will turn ON the transistor 98 to couple the global I/O line 14 to Vcc, which corresponds to logic "1," The high Data signal will maintain the transistor 94 in an OFF condition so that the complementary global I/O line 16 will remain at the ground voltage to which it was precharged. Thus, as indicated by the arrow labeled "Write Current Path," the flow of write data signals and hence write data current is from the write data driver circuit 90 to the sense amplifier 40 through the global I/O lines 14, 16.

The CT amplifier 36 embodiment shown in FIG. 2 may use substantially the same components used in the CT amplifier 26, and it may operate in substantially the same manner. Therefore, in the interests of brevity and clarity, the same reference numerals have been used, and an explanation of these components and their operation will not be repeated. The difference between the CT amplifier 26 and the CT amplifier 36 is that the CT amplifier 36 may include a read data driver circuit 100 that may be enabled by an active low RSelF signal to provide read data signals (corresponding to, for example, local data signals on the local I/O lines 30, 32) to the global I/O lines 14, 16 rather than a write data driver circuit 90 that may be enabled by an active tow WSelF signal to provide write data signals to the global I/O lines 14, 16. Also, the sense amplifier 40 included in the CT amplifier 36 may provide read data signals received from the global I/O lines 14, 16 to a data node rather than providing, write data signals received from the global I/O lines 14, 16 to the local I/O lines 30, 32 (e.g., for driving the local I/O lines). The transistors 66, 68 are turned ON by an active high RPr signal to precharge the complementary nodes of the sense amplifier 40 to ground prior to a read operation. As indicated by the arrow labeled "Read Current Path," the flow of read data signals and hence read data current is from the read driver circuit 100 to the sense amplifier 40 through the global I/O lines 14, 16. Additionally, the read driver circuit 100 may be powered by a voltage vcca rather than being powered by Vcc as in the write driver circuit 90. Filially, the CT amplifier 36 does not include the precharge transistors 70, 72 that may be used to precharge the local I/O lines 30, 32 to vcca in the CT amplifier 26.

Figure 3:
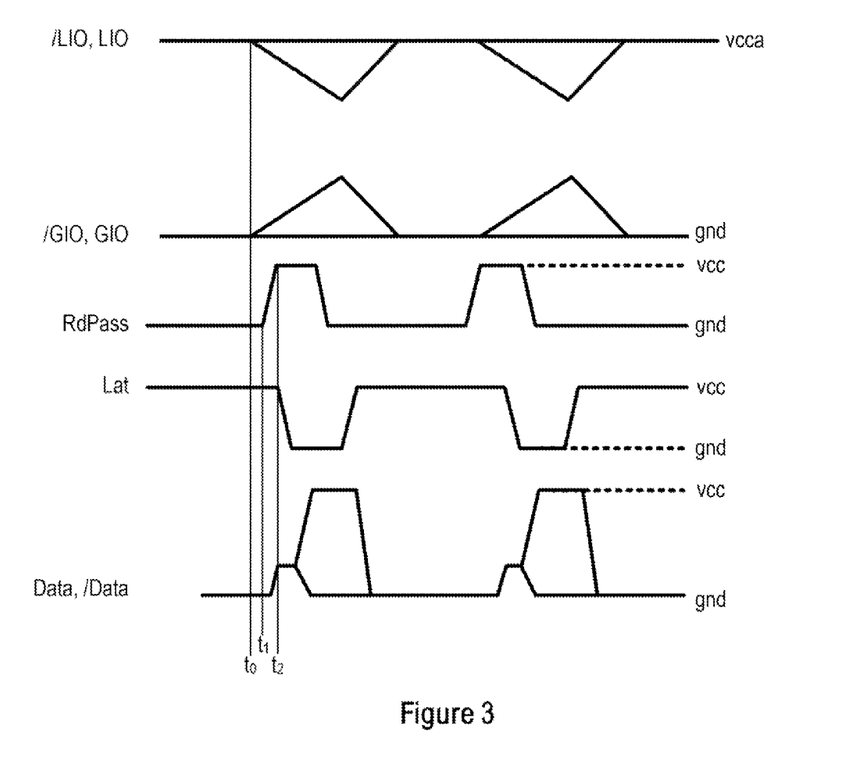
FIG. 3 is a timing diagram showing one embodiment of an operation of the data coupling circuit of FIG. 2.

The operation of the data coupling circuit 10 for a read operation can best be explained with reference to the timing diagram of FIG. 3. Prior to time to, the local I/O lines LIO, /LIO 30, 32 are precharged to the voltage vcca by turning ON the transistors 70, 72 responsive to the low /Pr signal, and the global I/O lines GIO, /GIO 14, 16 are precharged to ground by turning ON the transistors 76, 78 responsive to the high Pr signal. At time $t_0$, one of the local I/O lines 30, 32 is driven low by being coupled to a digit line (not shown) that is coupled to a memory cell. As a result, the read data driver circuit 100 drives one of the global I/O lines 14, 16 high, as shown in FIG. 3. The RdPass signal then transitions high at time $t_1$ to couple the global I/O lines 14, 16 to the sense amplifier 40 in the CT amplifier 36. At time $t_2$, the /RLat signal transitions low to enable the sense amplifier 40 in the CT amplifier 36 to drive one of the complementary nodes A, B (FIG. 2) of the sense amplifier 40 high. One of the drivers 60 then outputs a high Data signal while the other driver 62 outputs a low /Data signal. Although FIG. 3 shows the signals applied to the local I/O lines 30, 32 as being the inverse of the signals applied to the global I/O lines 14, 16, this may normally not be the case since both sets of signals are, of course, provided by different circuitry.

The CT amplifier 26 operates in substantially the same manner during a write operation except that the sequence of events described above occurs in the opposite direction.

Figure 4:
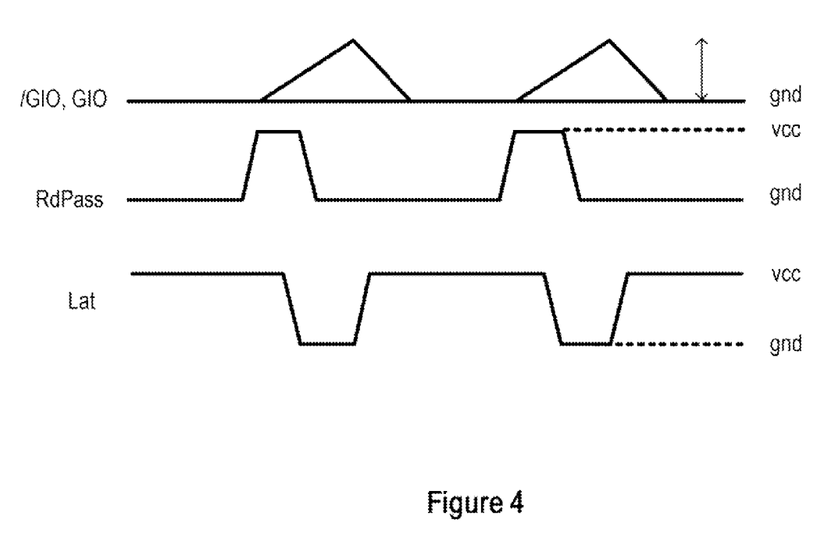
FIG. 4 is a timing diagram showing another embodiment of an operation of the data coupling circuit of FIG. 2.

In another embodiment shown in FIG. 4, the transistors 56, 58 in the CT-amplifier 26 are turned ON by the WrPass signal earlier than or at about the same time that the voltage on the global I/O lines start to change. Similarly, the transistors 56, 58 in the CT-amplifier 36 are turned ON by the RdPass signal earlier than or at about the same time that the voltage on the global I/O lines start to change. Additionally, the active low Lat signal (/Wlat in the case of the CT-amplifier 26 and /Rlat in the case of the CT-amplifier 36) may turn ON the respective transistors 50 shortly after the voltages on the global I/O lines 14, 16 and the local I/O lines 30, 32 start to change and turn OFF the respective transistors 50 when the complementary voltages on the I/O lines 14, 16 and 30, 32 have diverged sufficiently, such as by 30-50 mv in some embodiments.

Insofar as charge can be transferred through the transistors 56, 58 before they are turned fully ON, it is not necessary that the transistors 56, 58 have a low threshold voltage Vt, nor is it necessary that they have a high drain current Id and a high gate voltage. Therefore, in some embodiments, the transistors 56, 58 are thick oxide NAOX transistors. However, in other embodiments, the transistors 56, 58 are transistors having a normal, relatively thin oxide with a longer gate L to reduce any threshold voltage Vt mismatch between the transistors 56, 58.

Figure 5:
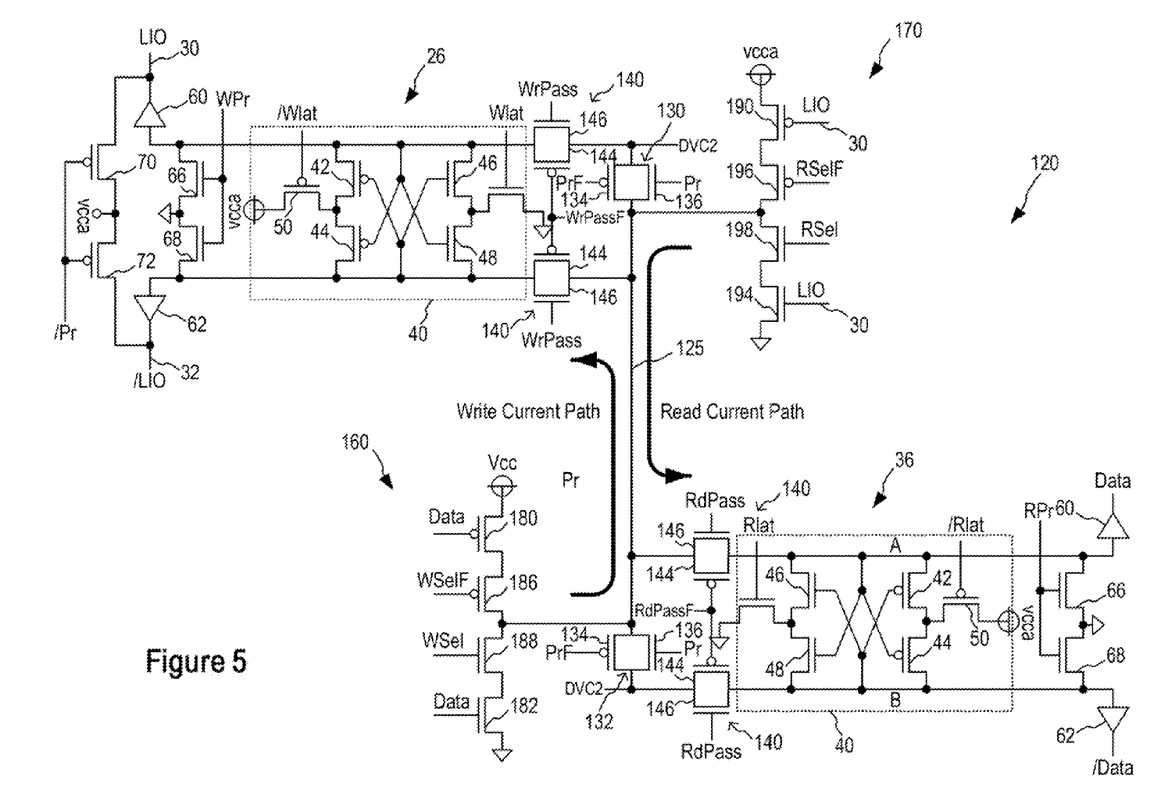
FIG. 5 is a logic diagram showing another embodiment of a data coupling circuit.

A data coupling circuit 120 according to another embodiment is shown in FIG. 5. The data coupling circuit 120 ma use substantially the same components used in the data coupling circuit 10 shown in FIG. 2, and it may operate in substantially the same manner. Therefore, in the interests of brevity and clarity, the same reference numerals have been used for the same components, and an explanation of these components and their operation will not be repeated. The differences between the data coupling circuit 120 and the data coupling circuit 10 are primarily the use of a single global I/O line GIO 125 rather than the complementary global I/O lines 14, 16 used in the data coupling circuit 10, and the manner in which signals are applied to the global I/O line 125. Specifically, the global I/O line 125 may be precharged by a voltage, such as DVC2, being applied to the global I/O line 125 through two pass gates 130, 132. In the embodiment of FIG. 5, DVC2 may have a magnitude that is half the magnitude of the voltage vcca to which the local I/O lines LIO, /LIO 30, 32 are precharged. Two pass gates 130, 132 may be used in the embodiment of FIG. 5 to more quickly precharge the global I/O line 125, particularly if it has a long length. However, in other embodiments a single pass gate may be used. Each pass gate 130 includes a p-channel transistor 134 that may receive an active low PrF signal at its gate and an n-channel transistor 136 that may receive an active high Pr signal at its gate.

Additionally, pass gates 140 may be used to couple the sense amplifiers 40 to the global I/O line 125 in the data coupling circuit 120 in place of the n-channel transistors 56, 58 used to couple the sense amplifiers 40 to the global I/O lines 14, 16 in the data coupling circuit 10. The sense amplifier 40 used for write operations may be coupled to the global I/O line 125 by a pass gate 140 that includes a p-channel transistor 146 receiving an active low WrPassF signal at its gate and an n-channel transistor 144 receiving an active high WrPass signal at its gate. Similarly, the sense amplifier 40 used for read operations may be coupled to the global I/O line 125 by a pass gate 140 that includes a p-channel transistor 146 receiving an active low RdPassF signal at its gate and an n-channel transistor 144 receiving an active high RdPass signal at its gate. In the embodiment shown in FIG. 5, the pass gates 140 connected to the sense amplifier nodes A receive the voltage DVC2 and apply that voltage to the sense amplifier lines A responsive to the active WrPass, WrPassF and RdPass. RdPassF signals.

Finally, the data coupling circuit 120 may include a write driver circuit 160 and a read driver circuit 170 that are configured to drive the global I/O line 125 either high or low instead of the write driver circuit 90 and the read driver circuit 100 used in the data coupling circuit 10 that are limited to driving the global I/O lines high. Specifically, the write driver circuit 160 may include a p-channel transistor 180 and an n-channel transistor 182 that receive the Data signal at their respective gates, a p-channel transistor 186 that receives the WSelF signal at its gate, and an n-channel transistor 138 that receives complement of the WSelF signal, i.e., a WSel signal, at its gate. The write driver circuit 160 may be powered by the voltage Vcc. Similarly, the read driver circuit 170 may include a p-channel transistor 190 and an n-channel transistor 194 that have their respective gates coupled to the local I/O line 30, a p-channel transistor 196 that receives the RSelF signal at its gate, and an n-channel transistor 198 that receives the complement of the RSelF signal, i.e., a RSel signal, at its gate. The voltage vcca may be used to supply power to the read driver circuit 170.

Figure 6:
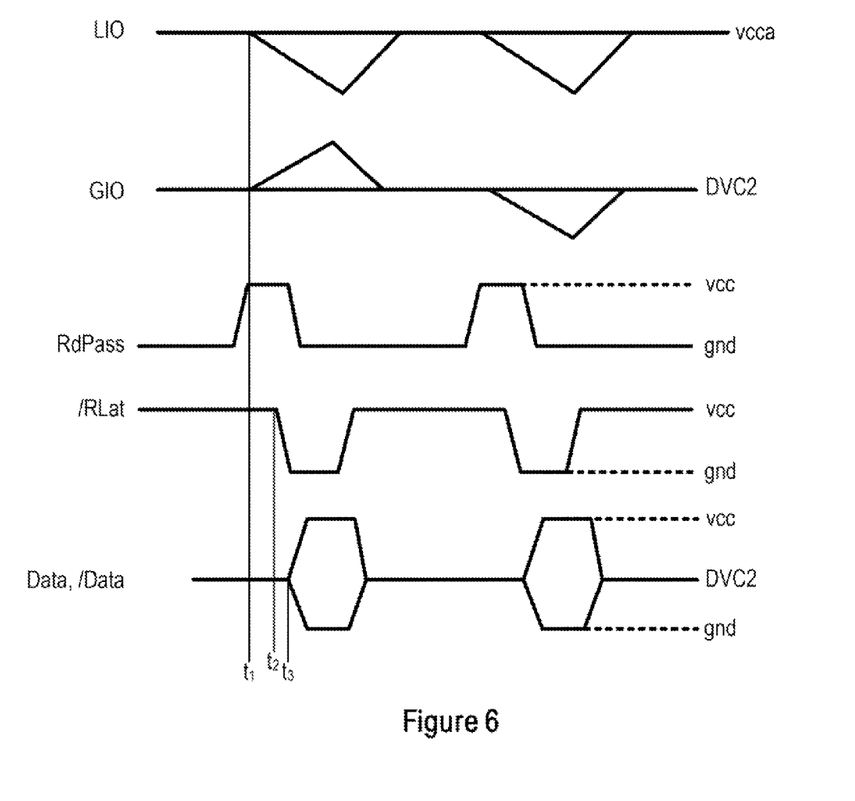
FIG. 6 is a timing diagram showing one embodiment of an operation of the data coupling circuit of FIG. 5.

The operation of the data coupling circuit 120 for a read operation may be explained with reference to FIG. 6. Prior to time $t_1$, the local I/O lines LIO, /LIO 30, 32 are again precharged to the voltage vcca. However, the global I/O line 125 is precharged to DVC2 by turning ON the pass gates 130, 132 responsive to the active Pr and PrF signals, as explained above with reference to FIG. 5. At time $t_1$, the local I/O) line 30 may be driven low, which turns ON the p-channel transistor 190 in the read driver circuit 170. As a result, Vcca is applied to the global I/O line 125 to drive the global I/O line 125 high as shown in FIG. 6. The RdPass signal may also transition active high (and the RdPassF signal may transition active low) to couple the sense amplifier 40 in the CT amplifier 36 to the global I/O line 125. At time $t_2$, the /RLat signal may transition active low (and the RLat signal may transition active high) to enable the sense amplifier 40 in the CT amplifier 36 to drive one of the complementary nodes A, 13 (FIG. 5) of the sense amplifier 40 high from the voltage DVC2 and the other low from the voltage DVC2 at time $t_3$ as shown in FIG. 5. As a result, one of the drivers 60 may then output a high Data signal while the other driver 62 may output a low /Data signal. The second waveform shown in FIG. 6 shows the local I/O line 30 driven low to turn ON the transistor 194 and drive the global I/O line low as shown in FIG. 6.

Although the present invention has been described with reference to the disclosed embodiments, persons skilled in the art will recognize that changes may be made in form and detail without departing from the invention. Such modifications are well within the skill of those ordinarily skilled in the art. Accordingly, the invention is not limited, except as by the appended claims.

I claim:

1. An apparatus, comprising:
    a first circuit coupled to a global input/output line and a local input/output line, the first circuit configured to provide write data of a first voltage to the global input/output line responsive to receiving external write data and further configured to provide the write data to the local input/output line from the global input/output line; and
    a second circuit coupled to the global input/output line and the local input output line, the second circuit configured to provide read data at a second voltage to the global input/output line from the local input/output line and further configured to provide the read data from the global input/output line to a data node, wherein the first and second voltages are different.

2. The apparatus of claim 1, further comprising a precharge circuit coupled to the global input/output line and configured to precharge the global input/output line to a ground voltage.

3. The apparatus of claim 1, further comprising a precharge circuit coupled to the global input/output line and configured to precharge the global input/output line to a voltage level substantially equal to half a supply voltage.

4. The apparatus of claim 1, wherein the first circuit comprises:
    a first sense amplifier configured to provide the write data from the global input/output line to the local input/output line; and
    a write driver configured to provide the write data to the global input/output line and further configured to couple the first voltage to the global input/output line responsive to an external data signal.

5. The apparatus of claim 1, wherein the second circuit comprises:
  a second sense amplifier configured to provide the read data from the global input/output line to the data node; and
  a read driver configured to provide the read data to the global input/output line and further configured to couple the second voltage to the global input/output line responsive to a read signal.

6. The apparatus of claim 1, wherein the global input/output line comprises first and second global input/output lines.

7. The apparatus of claim 1, wherein the first circuit is selectively coupled to the global input/output lines during a write operation.

8. The apparatus of claim 1, wherein the second circuit is selectively coupled to the global input/output lines during a read operation.

9. An apparatus, comprising:
  a first current transfer amplifier circuit configured to provide write data at a first voltage to a global/input output line responsive to a write signal, and further configured to selectively couple the write data from the global input/output line to a local input/output line responsive to a first control signal;
  a second current transfer amplifier circuit configured to provide read data at a second voltage to the global input/output line responsive to a read signal, and further configured to selectively couple the read data from the global input/output line to a data node responsive to a second control signal, wherein the second voltage is different than the first voltage; and
  a precharge circuit configured to precharge the global input/output line before a write operation.

10. The apparatus of claim 9, wherein the global input/output line is a single global input/output line.

11. The apparatus of claim 10, wherein the precharge circuit comprises pass gates coupled to the global input/output line and configured to precharge the global input/output line to a voltage half a supply voltage.

12. The apparatus of claim 9, wherein the first current transfer amplifier circuit comprises a first sense amplifier configured to receive the write data from the global input/output line based on the first control signal and provide the write data to the local input/output lines based on a third control signal.

13. The apparatus of claim 9, wherein the first current transfer amplifier circuit comprises a write data driver circuit configured to receive the write data and provide the write data to the global input/output line.

14. The apparatus of claim 9, wherein the second current transfer amplifier circuit comprises a second sense amplifier configured to receive the read data from the global input/output line based on the second control signal and provide the write data to the data node based on a fourth control signal.

15. The apparatus of claim 9, wherein the second current transfer amplifier circuit comprises a read data driver circuit configured to receive the read data from the local input/output line and provide the read data to the global input/output line.

16. The apparatus of claim 9, wherein the first current transfer amplifier circuit comprises a first pass gate configured to selectively couple the write data from the global input/output line to the local input/output line responsive to the first control signal.

17. The apparatus of claim 9, wherein the second current transfer amplifier circuit comprises a second pass gate configured to selectively couple the read data from the global input/output line to the data node line responsive to the second control signal.

18. An apparatus, comprising:
  a write driver circuit configured to provide write data at a first voltage to complementary global input/output lines in response to a write control signal;
  a first sense amplifier configured to provide the write data from the complementary global input/output lines to complementary local input/output lines;
  a read driver circuit configured to provide read data at a second voltage from the complementary local input/output lines in response to a read control signal; and
  a second sense amplifier configured to provide the read data from the complementary global input/output lines to output drivers,
  wherein the first voltage is different than the second voltage.

19. The apparatus of claim 18, further comprising a first precharge circuit configured to precharge complementary nodes of the first sense amplifier to ground prior to a write or a read operation.

20. The apparatus of claim 18, further comprising transistors coupled to the local input/output lines and configured to equilibrate the local input/output lines when activated.

21. The apparatus of claim 18, further comprising a first pass through transistor configured to selectively couple the first sense amplifier to the complementary global input/output lines when enabled.

22. The apparatus of claim 18, further comprising a second pass through transistor configured to selectively couple the second sense amplifier to the complementary global input/output lines when enabled.

* * * * *